(12) United States Patent
Liu et al.

(10) Patent No.: US 10,930,524 B2
(45) Date of Patent: Feb. 23, 2021

(54) SEMICONDUCTOR COMPONENT AND METHOD OF MANUFACTURE

(71) Applicant: SEMICONDUCTOR COMPONENTS INDUSTRIES, LLC, Phoenix, AZ (US)

(72) Inventors: Chun-Li Liu, Scottsdale, AZ (US); Ali Salih, Mesa, AZ (US); Mingjiao Liu, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/406,899

(22) Filed: May 8, 2019

(65) Prior Publication Data

US 2019/0267252 A1    Aug. 29, 2019

Related U.S. Application Data

(62) Division of application No. 15/202,917, filed on Jul. 6, 2016, now Pat. No. 10,388,539.

(Continued)

(51) Int. Cl.
*H01L 21/48* (2006.01)
*H01L 29/20* (2006.01)
(Continued)

(52) U.S. Cl.
CPC .......... *H01L 21/4853* (2013.01); *H01L 21/52* (2013.01); *H01L 23/492* (2013.01);
(Continued)

(58) Field of Classification Search
CPC ... H01L 21/4853; H01L 21/52; H01L 23/492; H01L 23/49844; H01L 23/49861; H01L 24/49; H01L 29/0003; H01L 23/49524; H01L 23/49562; H01L 23/49575; H01L 24/40; H01L 24/48; H01L 24/00; H01L 24/73; H01L 29/2003; H01L 2224/48091; H01L 2224/04042; H01L 2224/05553; H01L 2224/05554; H01L 2224/0603; H01L 2224/32145; H01L 2224/49052;
(Continued)

(56) References Cited

U.S. PATENT DOCUMENTS 5,280,193 A    1/1994  Lin et al.
5,332,864 A *  7/1994  Liang ................ H01L 23/49513
                                                        174/523

(Continued)

*Primary Examiner* — Dale E Page
*Assistant Examiner* — Quovaunda Jefferson
(74) *Attorney, Agent, or Firm* — Rennie William Dover

(57) ABSTRACT

In accordance with an embodiment, a semiconductor component includes a support having a side in which a device receiving structure and an interconnect structure are formed and a side from which a plurality of leads extends. A semiconductor device having a control terminal and first and second current carrying terminals and configured from a III-N semiconductor material is mounted to the device receiving structure. A first electrical interconnect is coupled between the first current carrying terminal of the semiconductor device and a first lead. A second electrical interconnect is coupled between the control terminal of the semiconductor device and a second lead.

20 Claims, 7 Drawing Sheets

Related U.S. Application Data

(60) Provisional application No. 62/196,629, filed on Jul. 24, 2015.

(51) Int. Cl.
  *H01L 23/00* (2006.01)
  *H01L 21/52* (2006.01)
  *H01L 23/492* (2006.01)
  *H01L 23/498* (2006.01)
  *H01L 25/065* (2006.01)
  *H01L 23/495* (2006.01)

(52) U.S. Cl.
  CPC .. *H01L 23/49844* (2013.01); *H01L 23/49861* (2013.01); *H01L 24/00* (2013.01); *H01L 24/49* (2013.01); *H01L 24/73* (2013.01); *H01L 25/0655* (2013.01); *H01L 29/2003* (2013.01); H01L 23/49524 (2013.01); H01L 23/49562 (2013.01); H01L 23/49575 (2013.01); *H01L 24/40* (2013.01); *H01L 24/48* (2013.01); H01L 2224/04042 (2013.01); H01L 2224/05553 (2013.01); H01L 2224/05554 (2013.01); H01L 2224/0603 (2013.01); H01L 2224/32145 (2013.01); H01L 2224/32225 (2013.01); H01L 2224/40227 (2013.01); H01L 2224/40237 (2013.01); H01L 2224/45014 (2013.01); H01L 2224/45015 (2013.01); H01L 2224/48091 (2013.01); H01L 2224/48227 (2013.01); H01L 2224/48237 (2013.01); H01L 2224/49051 (2013.01); H01L 2224/49052 (2013.01); H01L 2224/49111 (2013.01); H01L 2224/49175 (2013.01); H01L 2224/73221 (2013.01); H01L 2224/73263 (2013.01); H01L 2224/73265 (2013.01); H01L 2924/00014 (2013.01)

(58) Field of Classification Search
  CPC . H01L 2224/73263; H01L 2224/40237; H01L 2224/49051; H01L 2224/73221; H01L 2224/48227; H01L 2224/49111; H01L 2224/32225; H01L 2224/40277; H01L 2224/45014; H01L 2224/45015; H01L 2224/48237; H01L 2924/0001; H01L 21/492; H01L 25/0655; H01L 21/49252
  See application file for complete search history.

(56) References Cited

U.S. PATENT DOCUMENTS

| | | | |
|---|---|---|---|
| 5,436,492 A * | 7/1995 | Yamanaka | H01L 21/50 257/433 |
| 7,745,913 B2 | 6/2010 | Hosseini et al. | |
| 8,455,987 B1 | 6/2013 | Spann et al. | |
| 2005/0156204 A1* | 7/2005 | Uno | H01L 25/165 257/213 |
| 2007/0138606 A1* | 6/2007 | Brailey | H01L 23/49562 257/666 |
| 2007/0249092 A1 | 10/2007 | Joshi et al. | |
| 2008/0164590 A1 | 7/2008 | Xiaochun et al. | |
| 2010/0232131 A1 | 9/2010 | Qian et al. | |
| 2011/0133251 A1 | 6/2011 | He | |
| 2012/0223321 A1* | 9/2012 | Lin | H01L 23/49562 257/76 |
| 2013/0069208 A1 | 3/2013 | Briere | |
| 2013/0088280 A1 | 3/2013 | Lal et al. | |
| 2013/0175704 A1 | 7/2013 | Jeun | |
| 2013/0256856 A1 | 10/2013 | Mahler et al. | |
| 2014/0103510 A1 | 4/2014 | Andou | |
| 2014/0197525 A1 | 7/2014 | Kadoguchi | |
| 2014/0217566 A1* | 8/2014 | Goida | H01L 23/04 257/676 |
| 2014/0239472 A1 | 8/2014 | Jones et al. | |
| 2014/0361419 A1 | 12/2014 | Xue et al. | |
| 2015/0145112 A1 | 5/2015 | Otremba | |
| 2016/0211246 A1 | 7/2016 | Akiyama et al. | |
| 2016/0247792 A1 | 8/2016 | Chang | |

* cited by examiner

SEMICONDUCTOR COMPONENT AND METHOD OF MANUFACTURE

The present application is a Divisional patent application of U.S. patent application Ser. No. 15/202,917 filed on Jul. 6, 2016, by Chun-Li Liu et al., titled "SEMICONDUCTOR COMPONENT AND METHOD OF MANUFACTURE", which is a Nonprovisional patent application of Provisional Patent Application No. 62/196,629 filed on Jul. 24, 2015, by Chun-Li Liu et al., titled "SEMICONDUCTOR COMPONENT AND METHOD OF MANUFACTURE", which are hereby incorporated by reference in their entirety, and priority thereto for common subject matter is hereby claimed.

TECHNICAL FIELD

The present invention relates, in general, to electronics and, more particularly, to semiconductor structures thereof, and methods of forming semiconductor devices.

BACKGROUND

In the past, semiconductor manufacturers have used a combination of silicon semiconductor materials and III-N semiconductor materials to manufacture cascoded devices, such as a normally-on III-N depletion mode HEMT cascoded with a silicon device. Using this combination of materials helps achieve a normally-off state using a III-N depletion mode device that is normally-on. Cascoded semiconductor devices have been described in U.S. Patent Application Publication Number 2013/0088280 A1 by Rakesh K. Lal et al. and published on Apr. 11, 2013.

After manufacturing cascoded devices from different semiconductor substrate materials, semiconductor component manufacturers typically protect the silicon device and the depletion mode devices in separate packages and connect the devices in the separate packages together via leadframe leads to form a cascoded device. A drawback with this approach is that increasing the number of packages increases the cost of a cascoded semiconductor component and degrades the performance of the cascoded devices because of increased parasitics such as parasitic capacitance and parasitic inductance.

Accordingly, it would be advantageous to have a cascoded semiconductor device and a method for manufacturing the cascoded semiconductor device. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
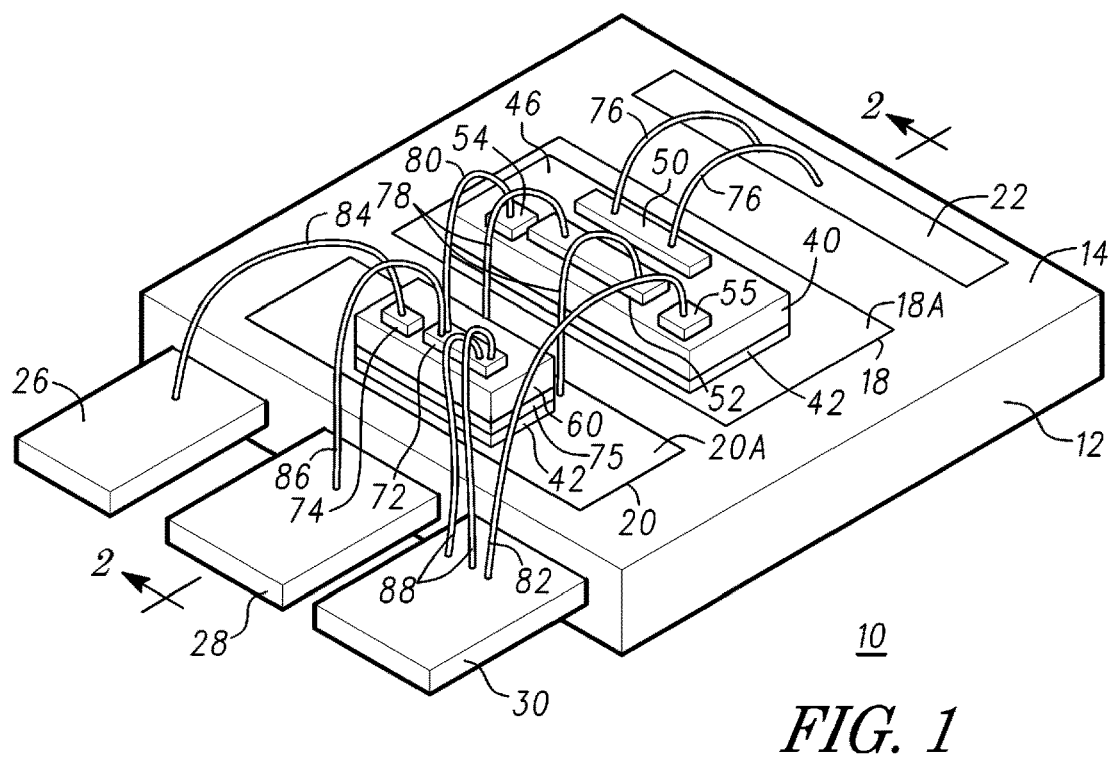
FIG. 1 is a perspective view of a semiconductor component in a cascode configuration in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of being exactly as described.

DETAILED DESCRIPTION

Figure 2:
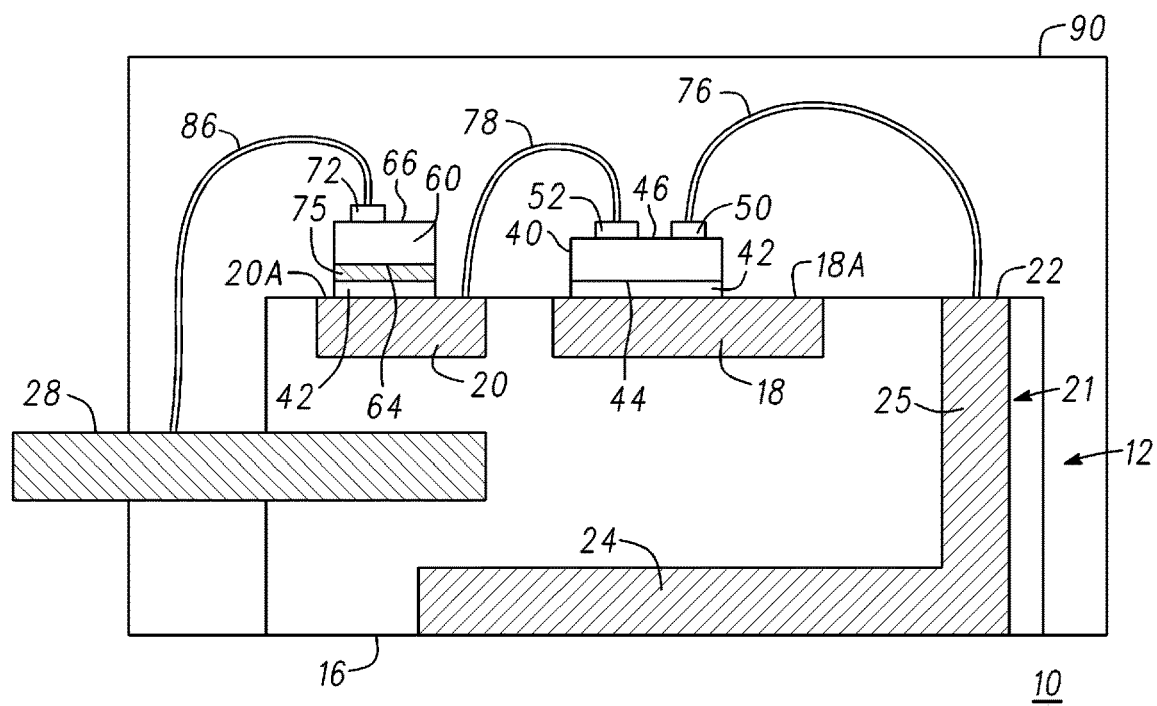
FIG. 2 is a cross-sectional view of the semiconductor component of FIG. 1 taken along section line 2-2 of FIG. 1.

FIG. 1 is a perspective view of a semiconductor component 10 in accordance with an embodiment of the present invention and FIG. 2 is a cross-sectional view of semiconductor component 10 taken along section line 2-2 of FIG. 1. FIGS. 1 and 2 are described together. What is shown in FIGS. 1 and 2 are a molded device support structure 12 having a top surface 14 and a bottom surface 16. Molded support structure 12 includes a device receiving area 18, a device receiving area 20, and a bond pad 22 at top surface 14 and a contact 24 at bottom surface 16. Device receiving areas 18 and 20 may be referred to as device receiving structures. Device receiving area 18 is configured for receiving a compound semiconductor device such as, for example, a III-nitride device whereas device receiving area 20 is configured for receiving a silicon semiconductor device. In accordance with an embodiment, device receiving area 18, device receiving area 20, and bond pad 22 are substantially coplanar with surface 14. Leadframe leads 26, 28, and 30 protrude from a side or an edge of molded device support structure 12. Molded support structure 12 may be formed by placing an electrically conductive strip in a mold having a mold cavity and injecting a mold compound into the mold cavity. The electrically conductive strip may include pads or plates 18 and 20 that serve as device receiving areas, an interconnect structure 21 that includes bond pad 22 integrally formed with contact 24 through a conductor 25, and a plurality of leadframe leads such as, for example, leadframe leads 26, 28, and 30. After injecting the mold compound into the cavities, the electrically conductive strip may be singulated into a plurality of molded support structures 12. Suitable materials for the electrically conductive strips include copper, aluminum, or the like. As mentioned, molded support structure 12 is illustrated and described as a single element; however, it may be a portion singulated from a leadframe strip encapsulated in a mold compound.

A semiconductor chip 40 is bonded to surface 18A of device receiving area 18 using a die attach material 42, wherein die attach material 42 is an electrically and thermally conductive die attach material. More particularly, surface 44 of semiconductor chip 40 is bonded to surface 18A of device receiving area 18 through electrically and thermally conductive die attach material 42. In accordance with an embodiment, semiconductor chip 40 is a compound semiconductor chip having opposing major surfaces 44 and 46, wherein semiconductor chip 40 includes a field effect semiconductor device having a drain contact 50 formed on or from a portion of surface 46, a source contact 52 formed on or from another portion of surface 46, and gate contacts 54 and 55 formed on or from other portions of surface 46. It should be noted that the semiconductor device is not limited to being a field effect transistor. For example, the semiconductor device may be an insulated gate bipolar transistor, a bipolar transistor, a junction field effect transistor, a diode, or the like. In accordance with embodiments in which a discrete semiconductor device such as for example, a field effect transistor, is formed from semiconductor chip 40, semiconductor chip 40 may be referred to as a semiconductor device. In addition, die attach material 42 is not limited to being an electrically conductive material but may be an electrically insulating material or a thermally conductive material. By way of example, semiconductor chip 40 is a III-nitride semiconductor chip, i.e., the substrate material of III-nitride semiconductor chip 40 comprises aluminum nitride. A III-nitride semiconductor material may be referred to as a III-N semiconductor material, a III-nitride based semiconductor material, a III-N based semiconductor material, or the like.

A semiconductor chip 60 is bonded to surface 20A of device receiving area 20 using die attach material 42. In accordance with an embodiment, semiconductor chip 60 is a silicon chip having opposing major surfaces 64 and 66, wherein semiconductor chip 60 includes a vertical field effect semiconductor device having a drain contact 75 formed on or from surface 64, a source contact 72 formed on or from a portion of surface 66, and a gate contact 74 formed on or from another portion of surface 66. Drain contact 75 is bonded to surface 20A of device receiving area 20 through die attach material 42. It should be noted that semiconductor device 60 is not limited to being a vertical field effect transistor or a field effect transistor. For example, the semiconductor device may be an insulated gate bipolar transistor, a bipolar transistor, a junction field effect transistor, a diode, or the like. By way of example, semiconductor chip 60 is a silicon semiconductor chip, i.e., the substrate material of silicon semiconductor chip 40 comprises silicon. A silicon semiconductor material may be referred to as silicon based semiconductor material, a silicon semiconductor material, or the like. In accordance with embodiments in which a discrete semiconductor device such as for example, a field effect transistor, is formed from semiconductor chip 60, semiconductor chip 60 may be referred to as a semiconductor device.

Drain contact 50 of semiconductor device 40 is electrically connected to bond pad 22 through bond wires 76, source contact 52 of semiconductor device 40 is electrically connected to device receiving area 20 through bond wires 78, gate contact 54 of semiconductor device 40 is electrically connected to source contact 72 through a bond wire 80, and gate contact 55 of semiconductor device 40 is electrically connected to leadframe lead 30 through a bond wire 82. Gate contact 74 of semiconductor device 60 is electrically connected to leadframe lead 26 through a bond wire 84, source contact 72 is connected to leadframe lead 28 through a bond wire 86 and to leadframe lead 30 through bond wires 88, and drain contact 75 is electrically connected to surface 20A of device receiving area 20 through electrically conductive die attach material 42. It should be noted that gate contact 54 is electrically connected to gate contact 55 through a metallization system (not shown). Bond wires may be referred to as wirebonds. It should be noted that in accordance with this embodiment semiconductor devices 40 and 60 are electrically connected to device receiving areas 18 and 20, respectively, through electrically conductive die attach material 42.

As those skilled in the art are aware, device receiving areas 18 and 20, semiconductor chips 40 and 60, and bond wires 76, 78, 80, 82, 84, 86, and 88 and portions of molded support structure 12 may be encapsulated in a protection material 90 such as, for example a mold compound. It should be noted that leadframe lead 26 serves as a gate leadframe lead or a gate lead, leadframe lead 28 serves as a Kelvin leadframe lead or a Kelvin lead, leadframe lead 30 servers as a source leadframe lead or a source lead, and contact 24 serves as a drain contact.

Thus, semiconductor component 10 includes a III-N cascode switch in which the substrate of the III-N semiconductor material is electrically floating and bond pads are not formed over active regions of semiconductor device 40.

Figure 3:
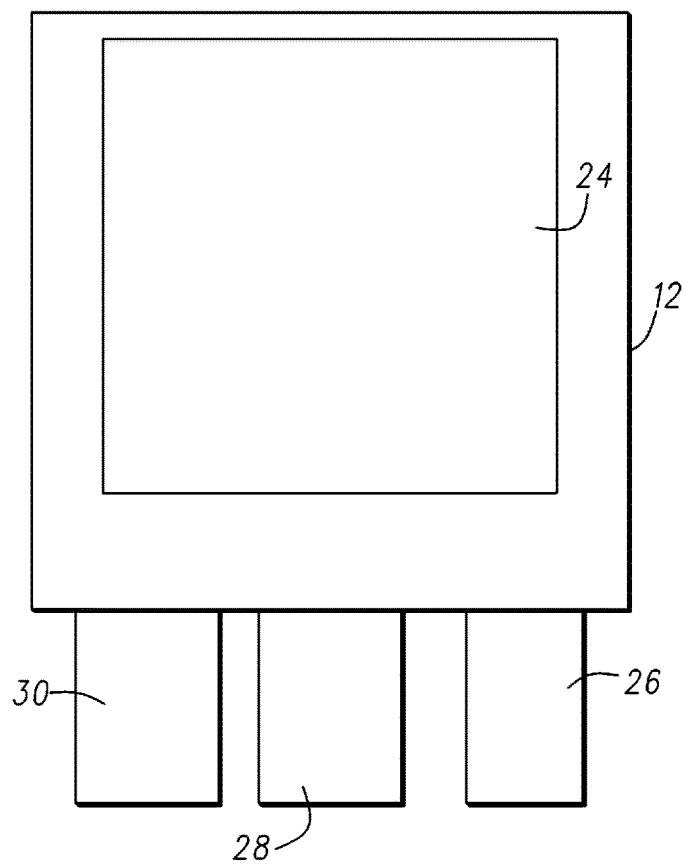
FIG. 3 is a bottom view of the semiconductor component of FIGS. 1 and 2.

FIG. 3 is a bottom view of semiconductor component 10 in accordance with an embodiment of the present invention. FIG. 3 further illustrates contact 24 and leadframe leads 26, 28, and 30.

Figure 4:
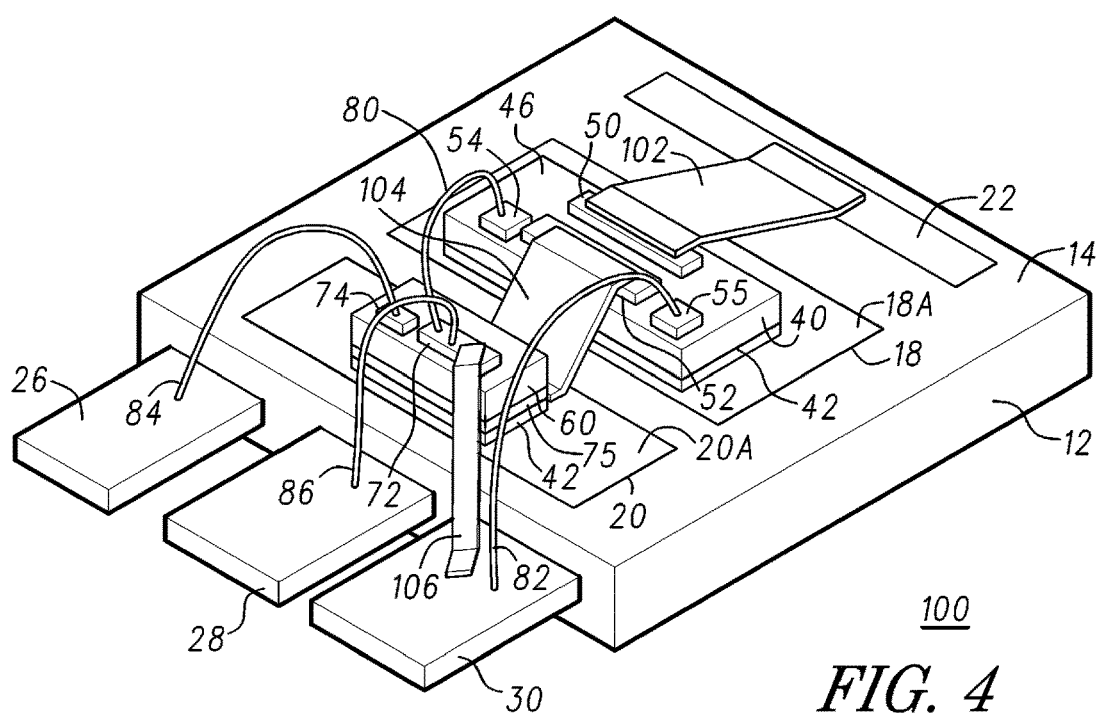
FIG. 4 is a perspective view of a semiconductor component in a cascode configuration in accordance with another embodiment of the present invention.

FIG. 4 is a perspective view of a semiconductor component 100 in accordance with another embodiment of the present invention. Semiconductor component 100 is similar to semiconductor component 10 except that bond wires 76 have been replaced by an electrically conductive clip 102, bond wires 78 have been replaced by an electrically conductive clip 104, and bond wires 88 have been replaced by an electrically conductive clip 106. It should be noted that mounting semiconductor chips 40 and 60 to device receiving areas 18 and 20, respectively, have been described with reference to FIGS. 1 and 2. Thus, semiconductor component 100 includes a III-N cascode switch in which the substrate of the III-N semiconductor material is electrically floating and bond pads are not formed over active regions of semiconductor device 40.

As those skilled in the art are aware, device receiving areas 18 and 20, semiconductor chips 40 and 60, and bond wires 80, 82, 84, 86, and 88, clips 102, 104, and 106, and portions of molded support structure 12 may be encapsulated in a protection material such as, for example mold compound 90.

Figure 5:
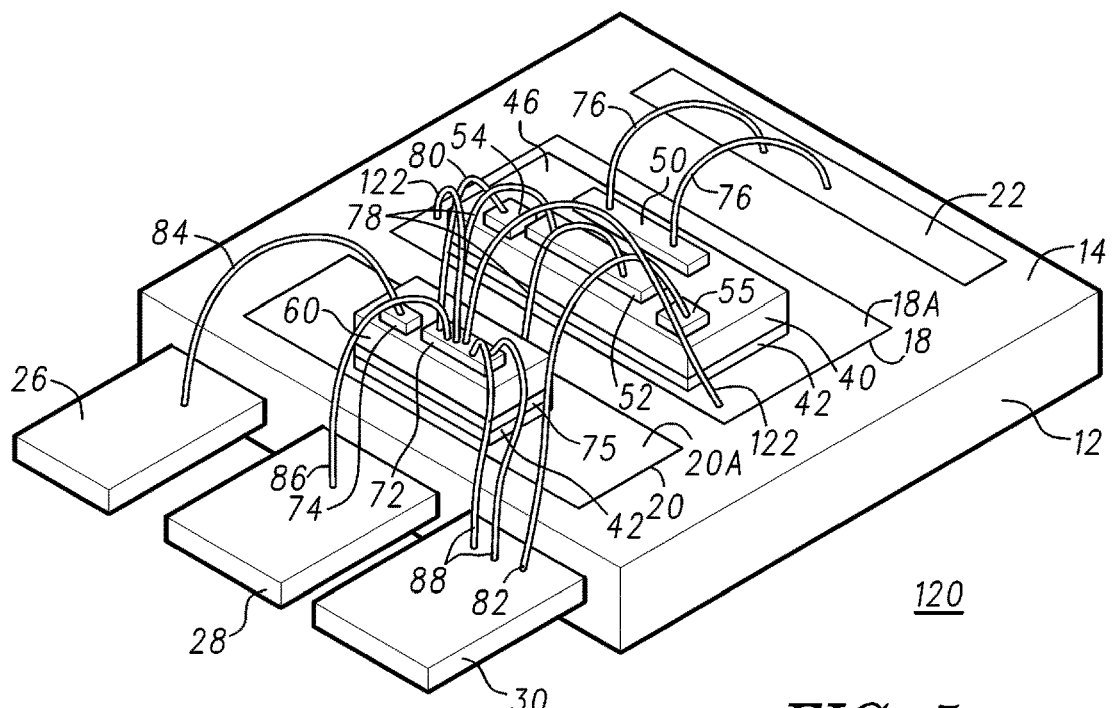
FIG. 5 is a perspective view of a semiconductor component in a cascode configuration in accordance with another embodiment of the present invention.

FIG. 5 is a perspective view of a semiconductor component 120 in accordance with another embodiment of the present invention. Semiconductor component 120 is similar to semiconductor component 10 except that semiconductor component 120 includes bond wires 122 connecting the semiconductor material of semiconductor chip 60 with surface 18A of device receiving area 18. It should be noted that mounting semiconductor chips 40 and 60 to device receiving areas 18 and 20, respectively, has been described with reference to FIGS. 1 and 2. Bond wires 122 electrically connect source electrode 72, hence the source, of semiconductor device 60 to the body of semiconductor material of semiconductor device 40 through die receiving area 18 and die attach material 42. Thus, semiconductor component 120 includes a III-N cascode switch in which the substrate of the III-N semiconductor material is grounded and bond pads are not formed over active regions of semiconductor device 40.

As those skilled in the art are aware, device receiving areas 18 and 20, semiconductor chips 40 and 60, and bond wires 76, 78, 80, 82, 84, 86, and 88 and portions of molded support structure 12 are typically encapsulated in a protection material such as, for example a mold compound.

Figure 6:
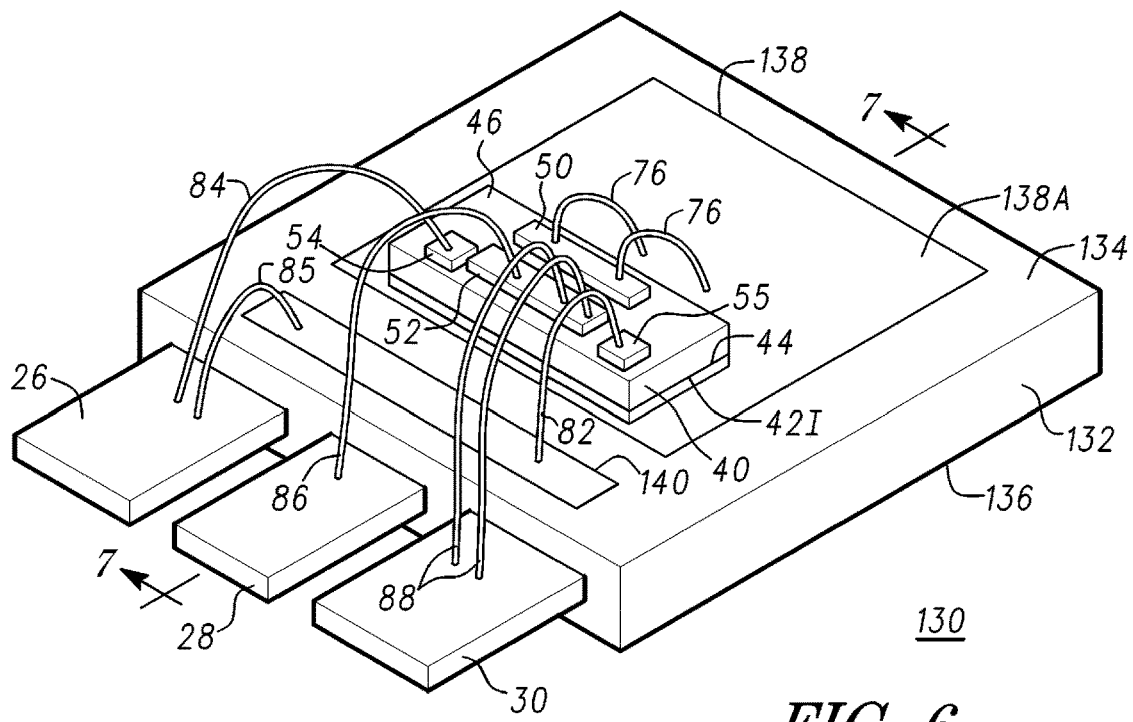
FIG. 6 is a perspective view of a semiconductor component in a cascode configuration in accordance with another embodiment of the present invention.
Figure 7:
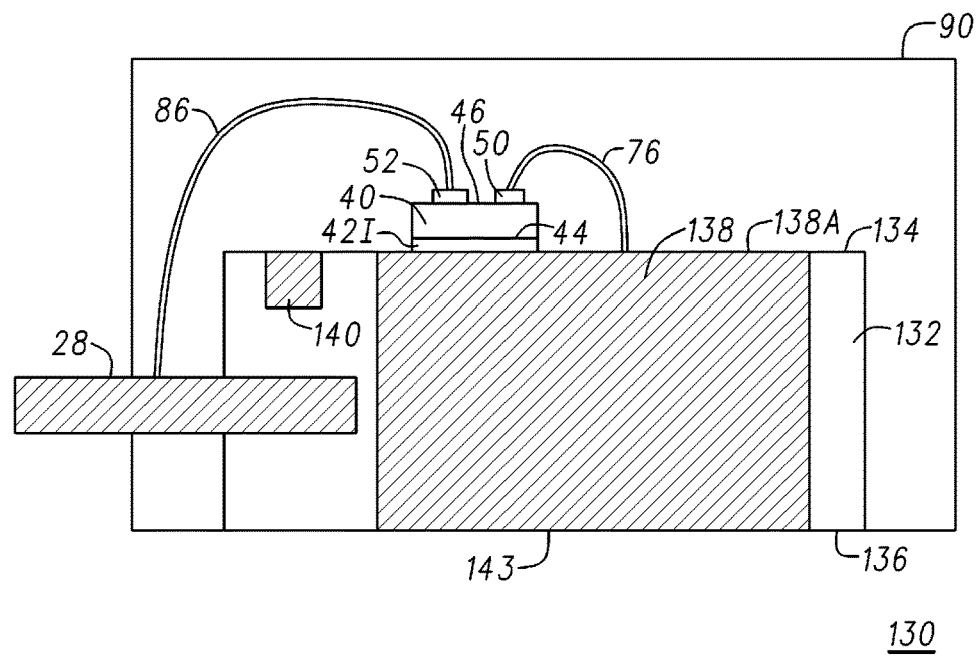
FIG. 7 is a cross-sectional view of the semiconductor component of FIG. 6 taken along section line 7-7 of FIG. 6.

FIG. 6 is a perspective view of a semiconductor component 130 in accordance with another embodiment of the present invention. FIG. 7 is a cross-sectional view of semiconductor component 130 taken along section line 7-7 of FIG. 6. FIGS. 6 and 7 are described together. What is shown in FIGS. 6 and 7 are a molded device support structure 132 having a top surface 134 and a bottom surface 136. Molded support structure 132 includes a device receiving area 138, a bond pad 140 at top surface 134, and a contact 143 at bottom surface 136. In accordance with an embodiment, bond pads 138 and 140 are coplanar with surface 134. Leadframe leads 26, 28, and 30 protrude from a side or an edge of molded device support structure 132. Device receiving area 138 may be referred to as a device receiving structure. Molded support structure 132 may be formed by placing an electrically conductive strip in a mold having a mold cavity and injecting a mold compound into the mold cavity. The electrically conductive strip may include a pad or plate 138 having a contact region 140, wherein pad or plate 138 serves as a device receiving area, and a plurality of leadframe leads such as, for example, leadframe leads 26, 28, and 30. After injecting the mold compound into the cavities, the electrically conductive strip may be singulated into a plurality of molded support structures 132. Suitable materials for the electrically conductive strips include copper, aluminum, or the like. As mentioned, molded support structure 132 is illustrated and described as a single element; however, it may be a portion singulated from a leadframe strip encapsulated in a mold compound.

A semiconductor chip 40 is bonded to surface 138A of device receiving area 138 using a die attach material 421, wherein die attach material 421 is an electrically insulating die attach material. In accordance with an embodiment, semiconductor chip 40 is a compound semiconductor chip having opposing major surfaces 44 and 46, wherein semiconductor chip 40 includes a field effect semiconductor device having a drain contact 50 formed on or from a portion of surface 46, a source contact 52 formed on or from another portion of surface 46, and gate contacts 54 and 55 formed on or from other portions of surface 46. Thus, surface 44 of semiconductor chip 40 is bonded to surface 138A of device receiving area 138 through die attach material 421. It should be noted that semiconductor device 40 is not limited to being a field effect transistor. For example, semiconductor device 40 may be an insulated gate bipolar transistor, a bipolar transistor, a junction field effect transistor, a diode, or the like. As discussed above, in accordance with embodiments in which a discrete semiconductor device such as for example, a field effect transistor, is formed from semiconductor chip 40, semiconductor chip 40 may be referred to as a semiconductor device.

Drain contact 50 of semiconductor device 40 is electrically connected to surface 138A of device receiving area 138 through bond wires 76, source contact 52 of semiconductor device 40 is electrically connected to leadframe lead 28 through a bond wire 86 and to leadframe lead 30 through bond wires 88, gate contact 54 of semiconductor device 40 is electrically connected to leadframe lead 26 through bond wire 84, gate contact 55 is electrically connected to bond pad 140 through a bond wire 82, and bond pad 140 is electrically connected to leadframe lead 26 through a bond wire 85. In accordance with the embodiment of FIG. 6, leadframe lead 26 is a gate leadframe lead or a gate lead, leadframe lead 28 is a Kelvin leadframe lead or a Kelvin lead, and leadframe lead 30 is a source leadframe lead or a source lead. Bond wires may be referred to as wirebonds. It should be noted that in accordance with this embodiment drain contact 50 of semiconductor device 40 is electrically connected to surface 138A of device receiving area 138. Thus, semiconductor component 130 includes a III-N cascode switch in which the substrate of the III-N semiconductor material is electrically floating and bond pads are not formed over active regions of semiconductor device 40.

As those skilled in the art are aware, device receiving area 138, semiconductor chip 40, and bond wires 76, 82, 84, 86, and 88 and portions of molded support structure 132 are typically encapsulated in a protection material such as, for example mold compound 90.

Figure 8:
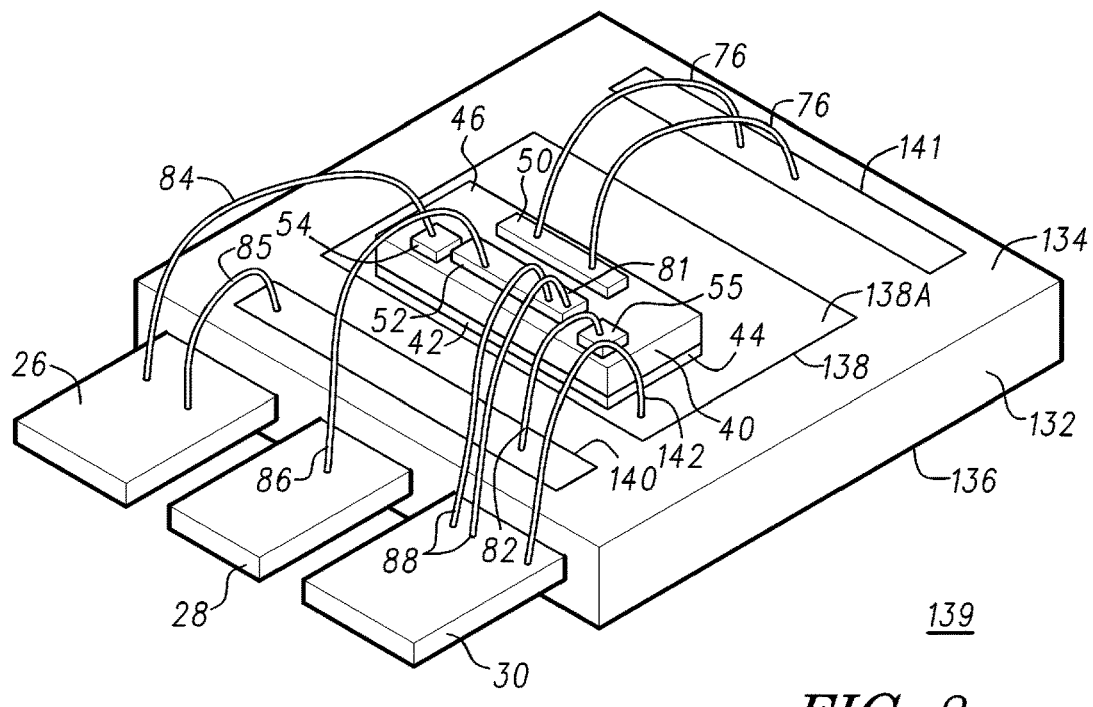
FIG. 8 is a perspective view of a semiconductor component in a cascode configuration in accordance with another embodiment of the present invention.

FIG. 8 is a perspective view of a semiconductor component 139 in accordance with another embodiment of the present invention. Semiconductor component 139 is similar to semiconductor component 130 except that the die attach material of FIG. 8, i.e., die attach material 42, is an electrically and thermally conductive material; and semiconductor component 139 includes bond pad 141 and a bond wire 142, wherein bond wire 142 connects device receiving area 138 with leadframe lead 30 and a bond pad 141 is connected to drain contact 50 through bond wires 76, unlike semiconductor component 130 in which bond wires 76 connect drain contact 50 with device receiving area 138, and wherein bond pads 140 and 141 are similarly configured to device receiving area 20 and bond pad 22 of FIG. 2, respectively. Bond pad 141 is spaced apart from device receiving area 138. It should be noted that gate leadframe lead 26 is electrically connected to gate electrode 54 via bond wire 84 and to bond pad 140 through bond wire 85. It should be further noted that mounting semiconductor chip 40 to device receiving area 138 has been described with reference to FIGS. 6 and 7. Bond wire 142 electrically connects the substrate of semiconductor chip 40 to source electrode 52 of semiconductor device 40 through leadframe lead 30, hence the source, of semiconductor device 40 is electrically connected to the body of semiconductor material of semiconductor device 40. Thus, semiconductor component 140 includes a discrete III-N field effect transistor in which the substrate of the III-N semiconductor material is grounded and bond pads are not formed over active regions of semiconductor device 40.

As those skilled in the art are aware, device receiving area 138, semiconductor chip 40, and bond wires 76, 82, 84, 85, 86, and 88 and portions of molded support structure 132 are typically encapsulated in a protection material such as, for example mold compound 90.

Figure 9:
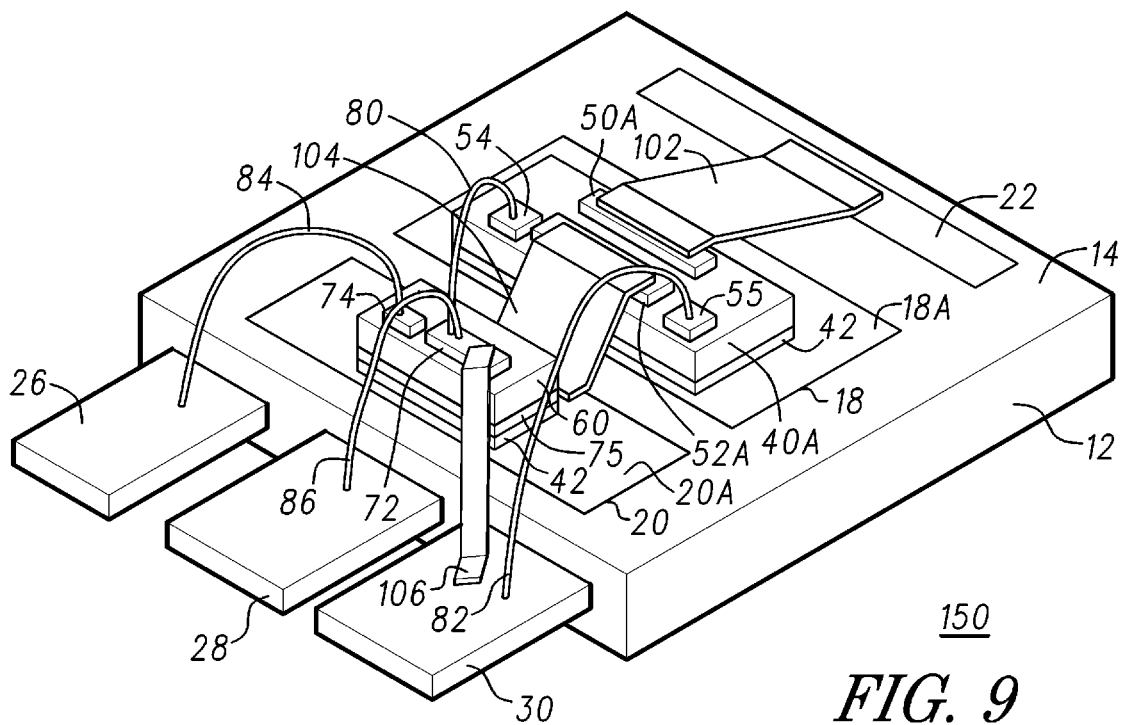
FIG. 9 is a perspective view of a semiconductor component in a cascode configuration in accordance with another embodiment of the present invention.

FIG. 9 is a perspective view of a semiconductor component 150 in accordance with another embodiment of the present invention. Semiconductor component 150 is similar to semiconductor component 100 described with reference to FIG. 4 except the semiconductor device is identified by reference character 40A, i.e., the letter A has been appended to reference character 40, because drain contact 50 has been replaced by a drain contact 50A which extends over a portion of an active area of III-N semiconductor device 40A and source contact 52 have been replaced by a source contact 52A which extends over another portion of the active area of III-N semiconductor device 40A. It should be noted that mounting semiconductor chips to device receiving areas has been described with reference to FIGS. 1 and 2. Thus, semiconductor component 150 includes a III-N cascode switch in which the substrate of the III-N semiconductor material is electrically floating and bond pads are formed over active regions of semiconductor device 40A.

As those skilled in the art are aware, device receiving areas 18 and 20, semiconductor chips 40A and 60, and bond wires 80, 82, 84, 86, and 88, clips 102, 104, and 106, and portions of molded support structure 12 are typically encapsulated in a protection material such as, for example mold compound 90.

Figure 10:
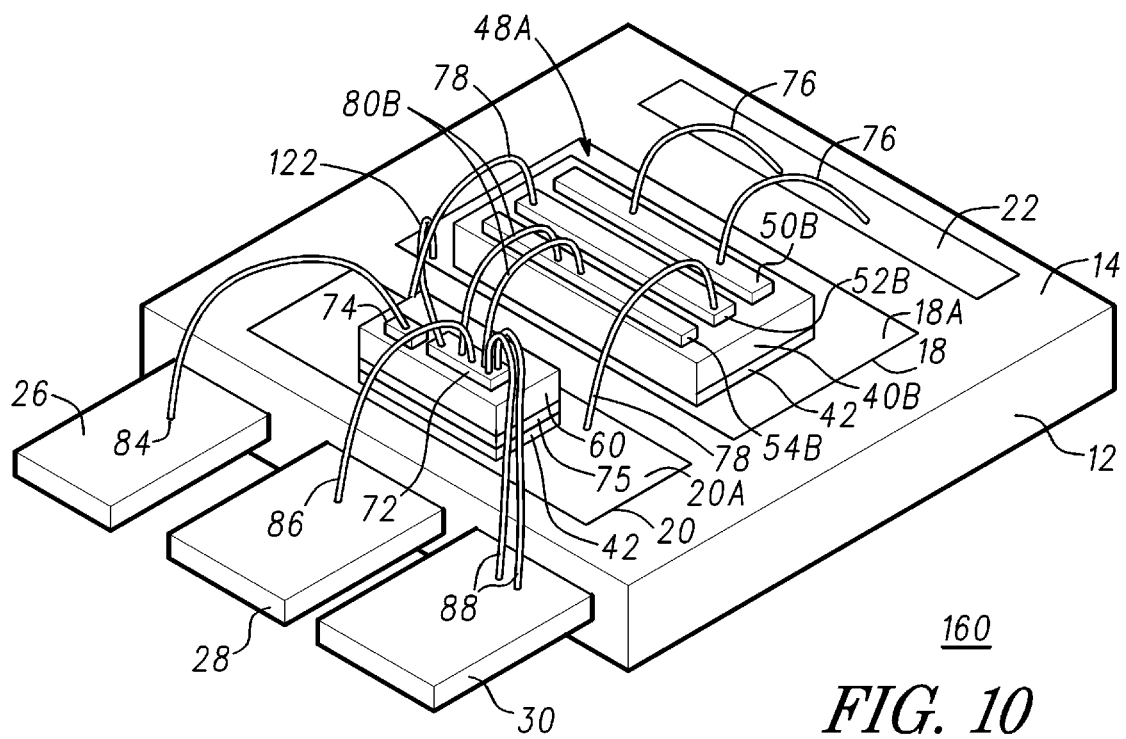
FIG. 10 is a perspective view of a semiconductor component in a cascode configuration in accordance with another embodiment of the present invention.

FIG. 10 is a perspective view of a semiconductor component 160 in accordance with another embodiment of the present invention. Semiconductor component 160 is similar to semiconductor component 120 described with reference to FIG. 5 except that drain contact 50 has been replaced by a drain contact 50B which extends over a portion of an active area of III-N semiconductor device 40B, source contact 52 has been replaced by a source contact 52B which extends over another portion of the active area of III-N semiconductor device 40B, and gate contacts 54 and 55 have been replaced by a gate contact 54B which extends over another portion of the active area of III-N semiconductor device 40B, bond wire 80 has been replaced by bond wires 80B, and bond wire 82 is not present in the embodiment of FIG. 10. A reference character B has been appended to reference character 40 to distinguish a semiconductor chip having bond pads over active areas from a semiconductor chip without bond pads over active areas. It should be noted that mounting semiconductor chips to device receiving areas has been described with reference to FIGS. 1 and 2. Thus, semiconductor component 160 includes a III-N cascode switch in which the substrate of the III-N semiconductor material is electrically grounded and bond pads are formed over active regions of semiconductor device 40B.

As those skilled in the art are aware, device receiving areas 18 and 20, semiconductor chips 40B and 60, and bond wires 76, 78, 80B, 84, 86, 88, and 122, and portions of molded support structure 12 are typically encapsulated in a protection material such as, for example a mold compound.

Figure 11:
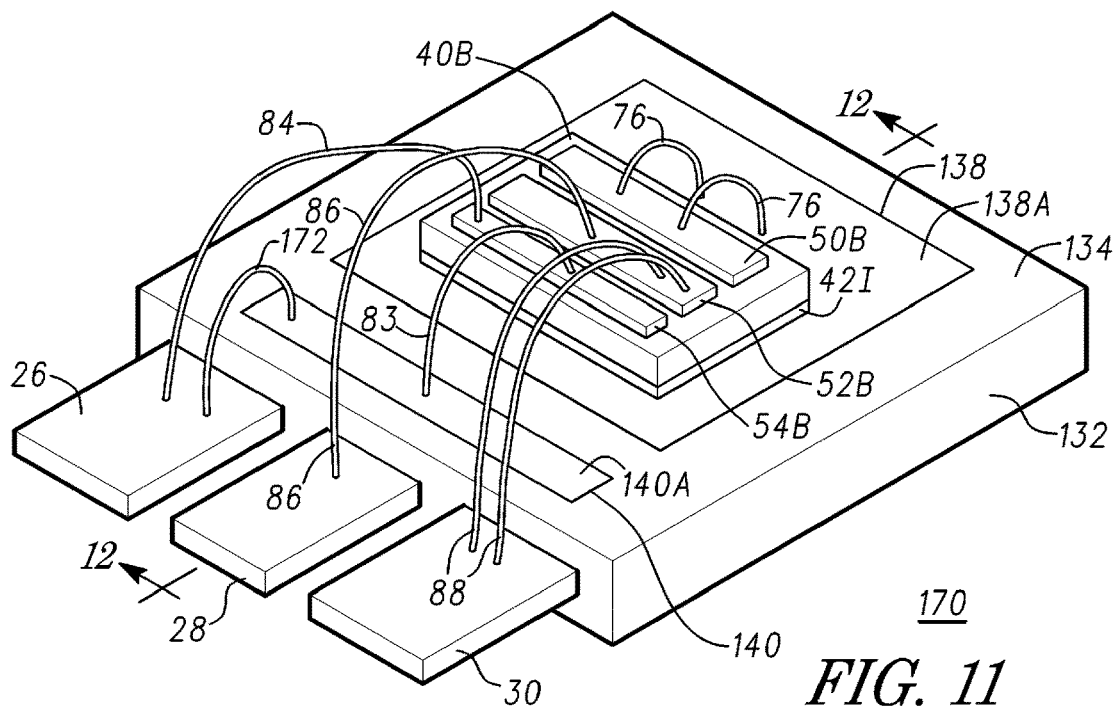
FIG. 11 is a perspective view of a semiconductor component in a cascode configuration in accordance with another embodiment of the present invention.
Figure 12:
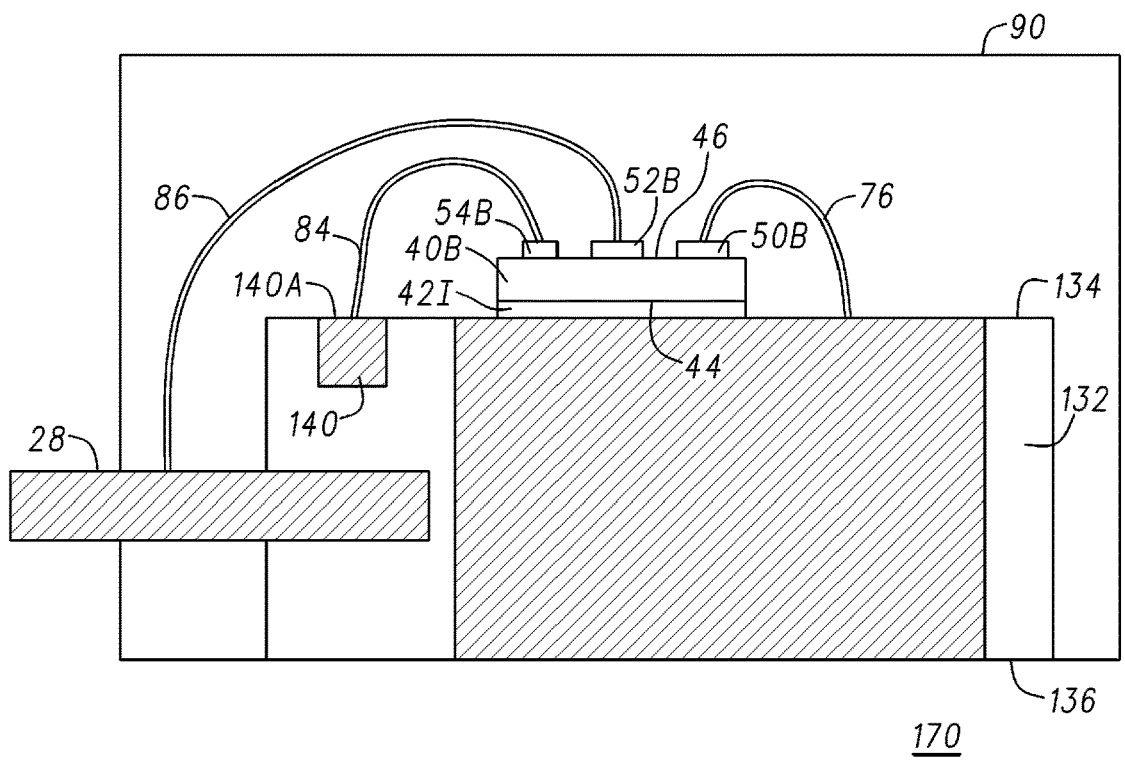
FIG. 12 is a cross-sectional view of the semiconductor component of FIG. 11 taken along section line 12-12 of FIG. 11.

FIG. 11 is a perspective view of a semiconductor component 170 in accordance with another embodiment of the present invention. FIG. 12 is a cross-sectional view of semiconductor component 170 taken along section line 12-12 of FIG. 11. FIGS. 11 and 12 are described together. What is shown in FIGS. 11 and 12 are a molded device support structure 132 that includes device receiving area 138 and bond pad 140, and leadframe leads 26, 28, and 30. Molded device support structure 132 has been described with reference to FIGS. 6 and 7.

A semiconductor chip 40B is bonded to surface 138A of device receiving area 138 using a die attach material 421, wherein die attach material 421 is an electrically insulating die attach material. Thus, surface 44 is bonded to surface 138A of device receiving area 138 through an electrically insulating die attach material 421. In accordance with an embodiment, semiconductor chip 40B is a compound semiconductor chip having opposing major surfaces 44 and 46, wherein semiconductor chip 40B includes a field effect semiconductor device having a drain contact 50B formed on a portion of an active area of semiconductor device 40B, a source contact 52B formed on another portion of the active area of semiconductor device 40B, and a gate contact MB formed on another portion of the active area of semiconductor device 40B. Semiconductor device 40B has been described with reference to FIG. 10.

Drain contact 50B of semiconductor device 40B is electrically connected to device receiving area 138 through bond wires 76, source contact 52B of semiconductor device 40B is electrically connected to leadframe lead 28 through a bond wire 86 and to leadframe lead 30 through bond wires 88, gate contact MB of semiconductor device 40B is electrically connected to leadframe lead 26 through bond wire 84. Bond pad 140 is electrically connected to leadframe lead 26 through a bond wire 172 and to gate contact MB through bond wire 83. In accordance with the embodiment of FIGS. 11 and 12, leadframe lead 26 is a gate leadframe lead or a gate lead, leadframe lead 28 is a Kelvin leadframe lead or a Kelvin lead, and leadframe lead 30 is a source leadframe lead or a source lead. Bond wires may be referred to as wirebonds. It should be noted that in accordance with this embodiment drain contact 50B of semiconductor device 40B is electrically connected to surface 138A of device receiving area 138 by bond wire 172. Thus, semiconductor component 170 includes a III-N cascode switch in which the substrate of the III-N semiconductor material is electrically floating and bond pads are formed over active regions of semiconductor device 40B.

Figure 13:
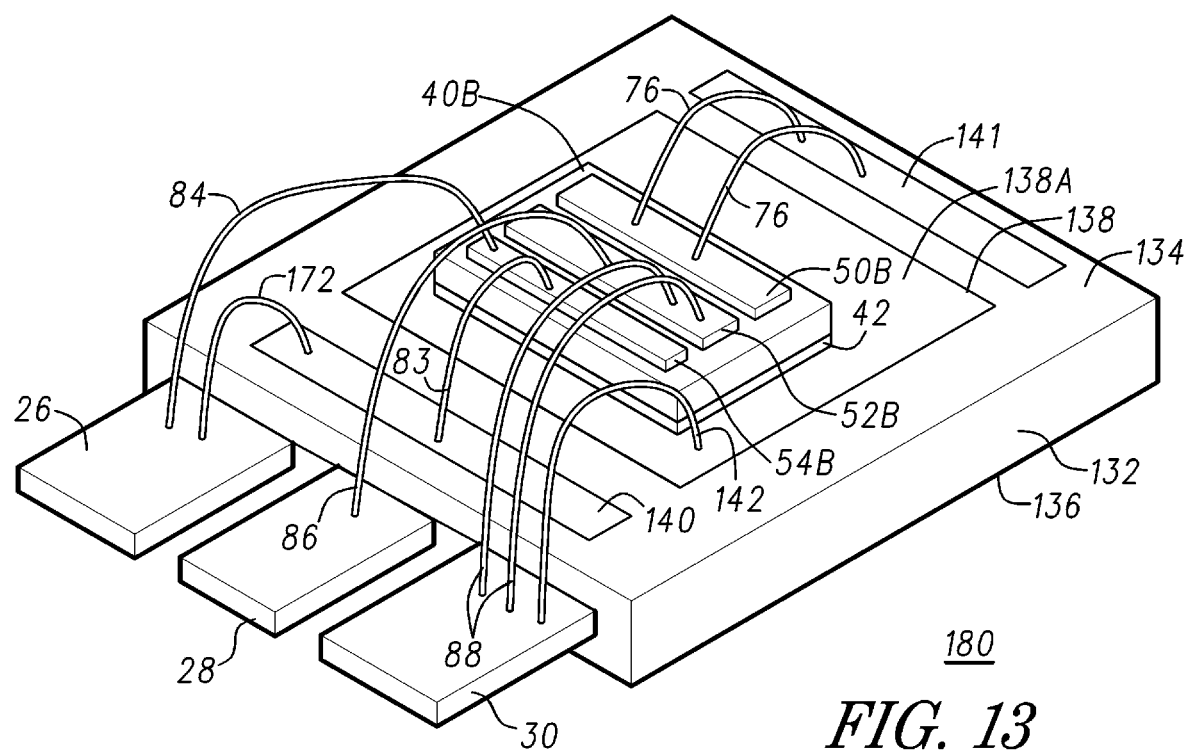
FIG. 13 is a perspective view of a semiconductor component in a cascode configuration in accordance with another embodiment of the present invention.

FIG. 13 is a perspective view of a semiconductor component 180 in accordance with another embodiment of the present invention. Semiconductor component 180 is similar to semiconductor component 139 except that semiconductor chip 40 of FIG. 8 has been replaced by a semiconductor chip 40B (shown in FIG. 11); semiconductor component 180 includes a bond pad 141 shown and described with reference to FIG. 8; bond wire 85 of semiconductor component 139 is replaced by a bond wire 172; and a bond wire 84 connects gate contact 54B to bond pad 140. Thus, drain contact 50B is electrically connected to bond pad 141 by bond wires 76, source contact 52B is electrically connected to lead 30 by bond wires 88 and to lead 28 by bond wire 86, and gate contact 54B is electrically connected to bond pad 140 by a bond wire 84 and to lead 26 by a bond wire 84. Bond wire 142 connects leadframe lead 30 with surface 138A of device receiving area 138. Bond wires 142 and 88 and leadframe lead 30 electrically connect source electrode 52B, hence the source of semiconductor device 40B, to the substrate of the semiconductor material of semiconductor device 40B. Thus, semiconductor component 180 includes a III-N cascode switch in which the substrate of the III-N semiconductor device is connected to its source and bond pads are formed over active regions of semiconductor device 40B. The source of the III-N semiconductor device can be connected to a potential such as, for example ground. Connecting the source of the III-N semiconductor device also connects the substrate of the III-N semiconductor device to ground in accordance with this embodiment.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A semiconductor component, comprising:
 a molded support structure having a top surface and a bottom surface, the molded support structure including:
  a device receiving structure embedded in a first portion of the molded support structure, the device receiving structure extending from the top surface into the molded support structure;
  a first bond pad embedded in a second portion of the molded support structure;
  a first leadframe lead extending from a third portion of the molded support structure, the first leadframe lead vertically positioned between the first bond pad and the bottom surface;
  a second leadframe lead extending from a fourth portion of the molded support structure, the second leadframe lead vertically positioned between the first bond pad and the bottom surface;
 a semiconductor device bonded to the device receiving structure, the semiconductor device having a control electrode, a first current carrying electrode, and a second current carrying electrode;
 a first electrical interconnect coupling the first leadframe lead to the first current carrying electrode of the semiconductor device;
 a second electrical interconnect coupling the second leadframe lead to the control electrode of the semiconductor device;
 a third electrical interconnect coupling the second current carrying electrode to the device receiving structure;
 a fourth electrical interconnect coupling a third leadframe lead to the first current carrying electrode of the semiconductor device; and
 a protection material over the semiconductor device, the first electrical interconnect, and the second electrical interconnect, and over at least a portion of the molded support structure.

2. The semiconductor component of claim 1, wherein the first electrical interconnect is a first bond wire, the second electrical interconnect is a second bond wire or a clip, and the third electrical interconnect is a third bond wire.

3. The semiconductor component of claim 1, wherein the control electrode, the first current carrying electrode, and the second current carrying electrode of the semiconductor device are over an active area of the semiconductor device, and wherein the semiconductor device is a III-N semiconductor device.

4. A semiconductor component, comprising:
 a device receiving structure embedded in a first portion of a mold compound;
 a first bond pad embedded in a second portion of the mold compound;
 a first leadframe lead extending from a third portion of the mold compound;
 a second leadframe lead extending from a fourth portion of the mold compound;
 a semiconductor device bonded to the device receiving structure, the semiconductor device having a control electrode, a first current carrying electrode, and a second current carrying electrode;
 a first electrical interconnect coupling the first leadframe lead to the first current carrying electrode of the semiconductor device;
 a second electrical interconnect coupling the second leadframe lead to the control electrode of the semiconductor device;
 a third electrical interconnect coupling the second current carrying electrode to the device receiving structure;
 a fourth electrical interconnect coupling a third leadframe lead to the first current carrying electrode of the semiconductor device;
 a fifth electrical interconnect coupling the first bond pad to the control electrode of the semiconductor device;
 a sixth electrical interconnect coupling the first bond pad to the second leadframe lead; and
 a protection material over the semiconductor device, the first electrical interconnect, and the second electrical interconnect, and over at least a portion of the mold compound.

5. The semiconductor component of claim 4, wherein the control electrode, the first current carrying electrode, and the second current carrying electrode of the semiconductor device are over an active area of the semiconductor device, and wherein the semiconductor device is a III-N semiconductor device.

6. A semiconductor component, comprising:
 a molded support structure having a top surface and a bottom surface, the molded support structure including:
  a device receiving structure embedded in a first portion of the molded support structure, the device receiving structure extending from the top surface into the molded support structure;
  a first bond pad embedded in a second portion of the molded support structure;
  a first leadframe lead extending from a third portion of the molded support structure, the first leadframe lead vertically positioned between the first bond pad and the bottom surface;
  a second leadframe lead extending from a fourth portion of the molded support structure, the second leadframe lead vertically positioned between the first bond pad and the bottom surface;
  a second bond pad embedded in a fifth portion of the molded support structure;
 a semiconductor device bonded to the device receiving structure, the semiconductor device having a control electrode, a first current carrying electrode, and a second current carrying electrode;
 a first electrical interconnect coupling the first leadframe lead to the first current carrying electrode of the semiconductor device;
 a second electrical interconnect coupling the second leadframe lead to the control electrode of the semiconductor device;

a third electrical interconnect coupling the second current carrying electrode to the second bond pad;

a fourth electrical interconnect coupling a third leadframe lead to the first current carrying electrode of the semiconductor device;

a fifth electrical interconnect coupling the first leadframe lead to the device receiving structure; and a protection material over the semiconductor device, the first electrical interconnect, and the second electrical interconnect, and over at least a portion of the molded support structure.

7. The semiconductor component of claim 6, wherein the control electrode, the first current carrying electrode, and the second current carrying electrode of the semiconductor device are over an active area of the semiconductor device, and wherein the semiconductor device is a III-N semiconductor device.

8. The semiconductor component of claim 6, wherein the first electrical interconnect is a first bond wire, the second electrical interconnect is a second bond wire, and the third electrical interconnect is a third bond wire.

9. A semiconductor component, comprising:

a molded support having first and second surfaces and a plurality of leads, the first surface of the molded support having a device receiving structure and a first bond pad, the first bond pad adjacent the device receiving structure and wherein the device receiving structure and the first bond pad extend into the molded support from the first surface, the second surface of the molded support having a contact that extends into the molded support from the second surface, a first leadframe lead extending from a first side of the molded support and a second leadframe lead extending from the first side of the molded support, the first leadframe lead and the second leadframe lead vertically positioned between the first bond pad and the second surface;

a semiconductor device mounted to a portion of the device receiving structure at the first surface of the molded support, the semiconductor device having a control terminal and first and second current carrying terminals and configured from a III-N semiconductor material;

a first electrical interconnect coupled between the first current carrying terminal of the semiconductor device and the first leadframe lead;

a second electrical interconnect coupled between the control terminal of the first semiconductor device and the second leadframe lead; and a protection material over the semiconductor device, the first electrical interconnect, the second electrical interconnect, the first leadframe lead, the second leadframe lead, and over the molded support.

10. The semiconductor component of claim 9, further including a third electrical interconnect coupled between the second current carrying terminal and the device receiving structure.

11. The semiconductor component of claim 10, further including a third leadframe lead extending from the first side of the molded support and a fourth electrical interconnect coupled between the third leadframe lead and the first current carrying terminal.

12. The semiconductor component of claim 9, wherein the first electrical interconnect is a first bond wire, the second electrical interconnect is a second bond wire, and the third electrical interconnect is a third bond wire.

13. The semiconductor component of claim 9, wherein the first current carrying terminal of the first semiconductor device and the second current carrying terminal of the first semiconductor device are over active regions of the first semiconductor device.

14. The semiconductor component of claim 9, further including a third electrical interconnect coupled between the first leadframe lead and the first current carrying terminal of the semiconductor device.

15. The semiconductor component of claim 9, further including a second bond pad extending into the molded support and a third electrical interconnect coupled between the second current carrying terminal of the semiconductor device and the second bond pad.

16. The semiconductor component of claim 9, further including an electrically insulating material between the device receiving structure and the semiconductor device.

17. A method for manufacturing a semiconductor component, comprising:

forming a molded support from a first mold compound, the molded support having first and second opposing sides and third and fourth opposing sides, wherein the molded support has a first leadframe lead extending from the first side, a device receiving structure extending from a first portion of the third side into the first mold compound, a first bond pad extending from a second portion of the third side into the first mold compound, and a contact extending from a first portion of the fourth side into the first mold compound, wherein a portion of the first leadframe lead is embedded in a first portion of the first mold compound and vertically positioned between the first bond pad and the fourth opposing side;

mounting a semiconductor device to the device receiving structure using a die attach material, the semiconductor device having a control terminal and first and second current carrying terminals and configured from a III-N semiconductor material;

electrically coupling the first current carrying terminal of the semiconductor device to one of the first leadframe lead;

electrically coupling the control terminal of the semiconductor device to a second leadframe lead; and protecting the semiconductor device, a portion of the first lead, and a portion of the molded support with a second mold compound, wherein the second mold compound serves as a protection material.

18. The method of claim 17, further including forming the control terminal, the first current carrying terminal, and the second current carrying terminal of the semiconductor device over an active area of the semiconductor device.

19. The method of claim 17, further including electrically coupling the second current carrying terminal of the semiconductor device to the device receiving structure, wherein the die attach material is an electrically insulating die attach material.

20. The method of claim 17, wherein forming the molded support further includes forming a second bond pad extending from a third portion of the third side into the first mold compound and further including coupling the second current carrying terminal of the semiconductor device to the second bond pad, wherein the die attach material is an electrically conductive die attach material.

* * * * *